(12) United States Patent
Lee

(10) Patent No.: US 8,210,355 B2
(45) Date of Patent: Jul. 3, 2012

(54) TRAY ASSEMBLY

(75) Inventor: Chai-Wei Lee, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/875,152

(22) Filed: Sep. 3, 2010

(65) Prior Publication Data

US 2011/0253588 A1 Oct. 20, 2011

(30) Foreign Application Priority Data

Apr. 16, 2010 (TW) ................................ 99112090 A

(51) Int. Cl.
*B65D 1/34* (2006.01)

(52) U.S. Cl. ........................................ 206/558; 206/562

(58) Field of Classification Search .................. 206/557, 206/558, 560, 562, 565, 316.1; 220/23.4
See application file for complete search history.

(56) References Cited

U.S. PATENT DOCUMENTS

| | | | | |
|---|---|---|---|---|
| 2,110,921 A | * | 3/1938 | Scurlock | 220/23.4 |
| 3,204,774 A | * | 9/1965 | Barbieri | 211/4 |
| 3,384,260 A | * | 5/1968 | Buffington | 206/558 |
| 3,398,827 A | * | 8/1968 | Laskin | 206/499 |
| 3,532,221 A | * | 10/1970 | Kaluhiokalani et al. | 211/70.6 |
| 3,917,106 A | * | 11/1975 | Bargetzi | 220/23.83 |
| 4,068,760 A | * | 1/1978 | Johnson, Jr. | 211/74 |
| 4,191,291 A | * | 3/1980 | Brown | 206/369 |
| 4,258,847 A | * | 3/1981 | Nierman | 206/504 |
| 4,429,796 A | * | 2/1984 | Sussman | 211/11 |
| 4,454,949 A | * | 6/1984 | Flum | 211/59.2 |
| 4,877,659 A | * | 10/1989 | Vince | 428/34.1 |
| 5,147,038 A | * | 9/1992 | Pergeau | 206/373 |
| 5,265,735 A | * | 11/1993 | Hassel et al. | 211/11 |
| 5,988,394 A | * | 11/1999 | Emoto et al. | 206/724 |
| 6,258,041 B1 | * | 7/2001 | Pitesky | 600/556 |
| 6,382,417 B2 | * | 5/2002 | Kanner et al. | 206/366 |

* cited by examiner

*Primary Examiner* — Jacob K Ackun
(74) *Attorney, Agent, or Firm* — Altis Law Group, Inc.

(57) ABSTRACT

A tray assembly includes at least one tray device. The at least one tray device includes an angled top wall and a sidewall connecting with the angled top wall. The angled top wall includes an upper surface defining a plurality of receiving portions. Each receiving portion is configured for receiving a lens holder.

16 Claims, 7 Drawing Sheets

TRAY ASSEMBLY

BACKGROUND

1. Technical Field

The present disclosure relates to a tray assembly for a lens holder used during a vacuum coating process.

2. Description of Related Art

Many camera modules used in electronic devices such as digital cameras include lens holders for holding lenses. The lens holders often provide an EMI shield coating. The coating can be applied by any conventional technique such as vacuum coating. In the case of vacuum coating, the lens holders need to be positioned on a receiving portion of a tray in a vacuum environment. The lens holder is held in position by a positioning post extending through the lens holder and the tray, which creates a closed cavity. The number of receiving portions on the tray is limited, because the tray is a flat plate, such that production efficiency of the tray is limited. The receiving portions of the tray are crowded and efficiency of heat dissipation is reduced.

It is thus desirable to provide a tray assembly which can overcome the described limitations.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
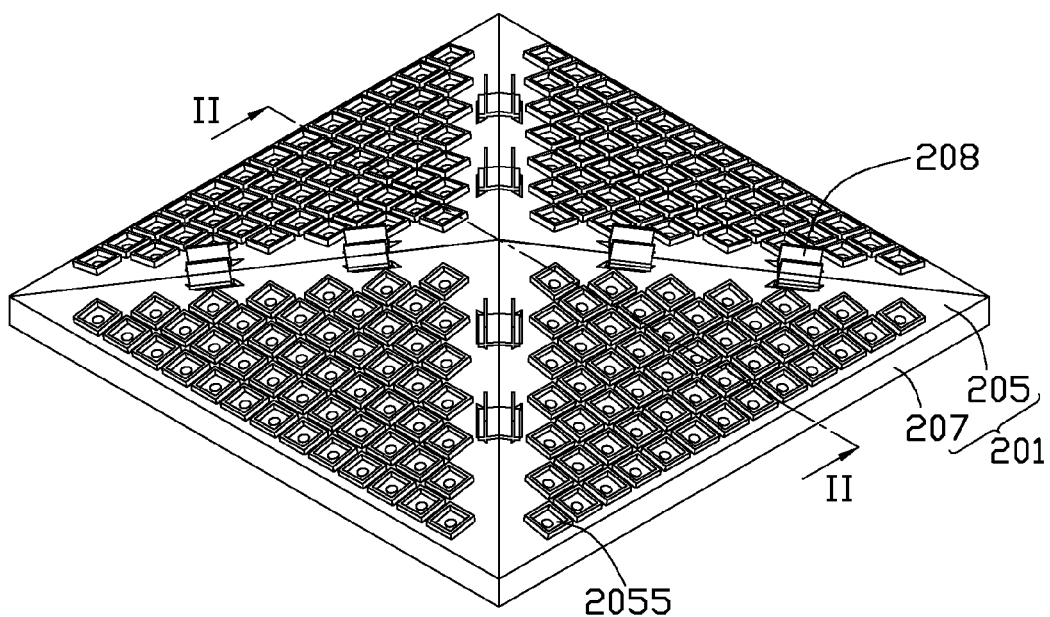
FIG. 1 is an isometric view of a tray assembly including a plurality of tray devices in accordance with a first embodiment.
Figure 2:
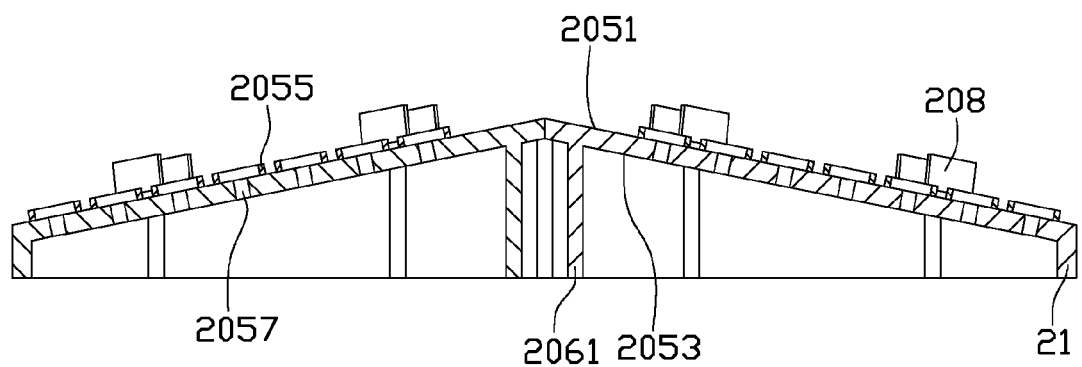
FIG. 2 is a cross-section of the tray assembly of FIG. 1, taken along the line II-II of FIG. 1.

Referring to FIGS. 1 and 2, a tray assembly 20 according to a first embodiment includes a plurality of tray devices 201 and a plurality of fixing members 208. The tray devices 201 are configured for supporting lens holders 30 during vacuum coating of the lens holders 30.

Figure 3:
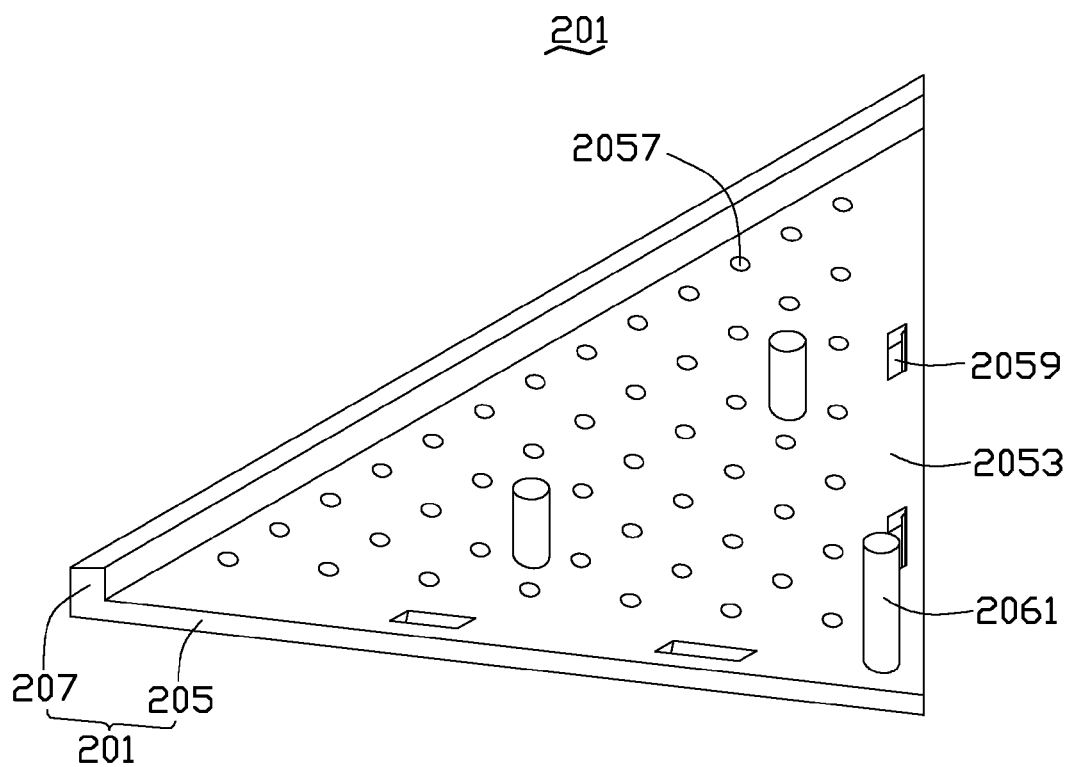
FIG. 3 is an exploded, partially enlarged isometric view of FIG. 1, but viewed from another aspect.

Each tray device 201 includes an angled top wall 205 connected to a sidewall 207. Also referring to FIG. 3, each top wall 205 of the tray device 201 includes an upper surface 2051 defining a plurality of receiving portions 2055 and a lower surface 2053 providing a plurality of support posts 2061. The receiving portion 2055 of the tray device 201 is configured for receiving a lens holder 30. A retaining hole 2057 is formed in the center of the receiving portion 2055. A plurality of fixing holes 2059 is defined in the edge of the top wall 205 of the tray device 201. In the first embodiment, the top wall 205 is triangular. The tray assembly 20 includes four tray devices 201.

Figure 4:
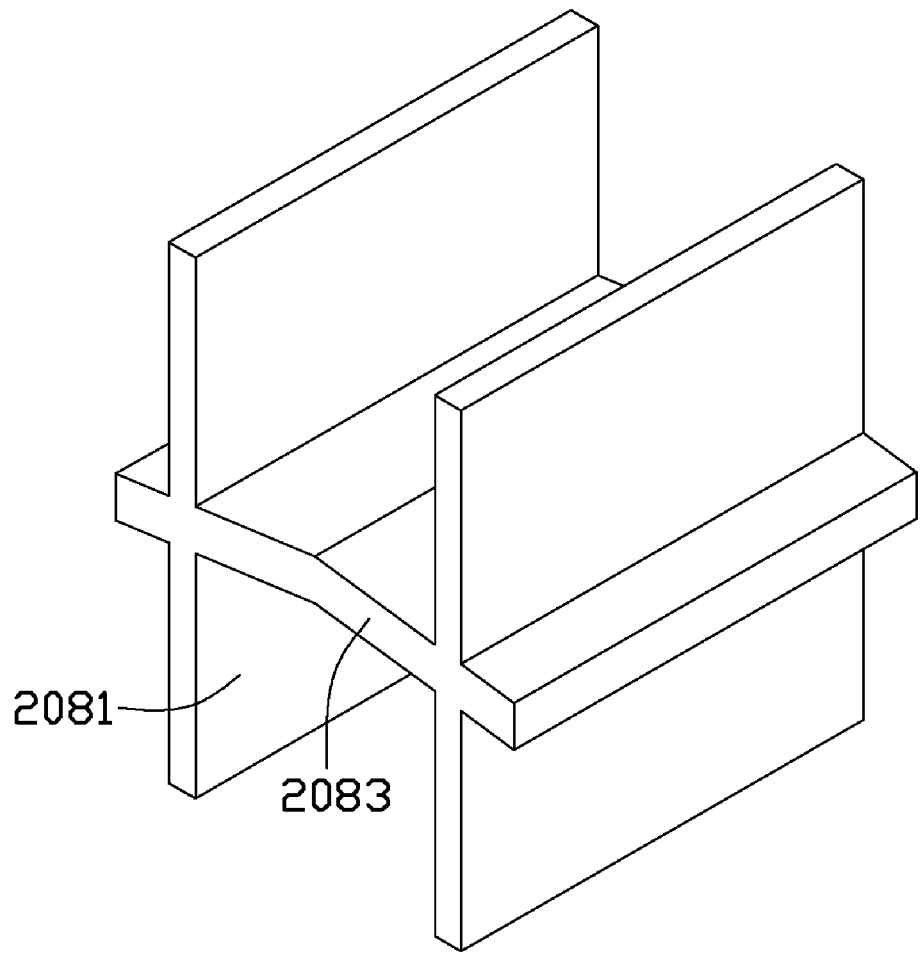
FIG. 4 is a schematic view of a fixing member in accordance with the first embodiment.

Also referring to FIG. 4, the fixing member 208 includes a main body 2083 and two spaced tabs 2081 extending from the main body 2083. The tabs 2081 of the fixing member 208 are received in the fixing holes 2059 of the adjacent tray devices 201 to fasten the tray devices 201.

Figure 5:
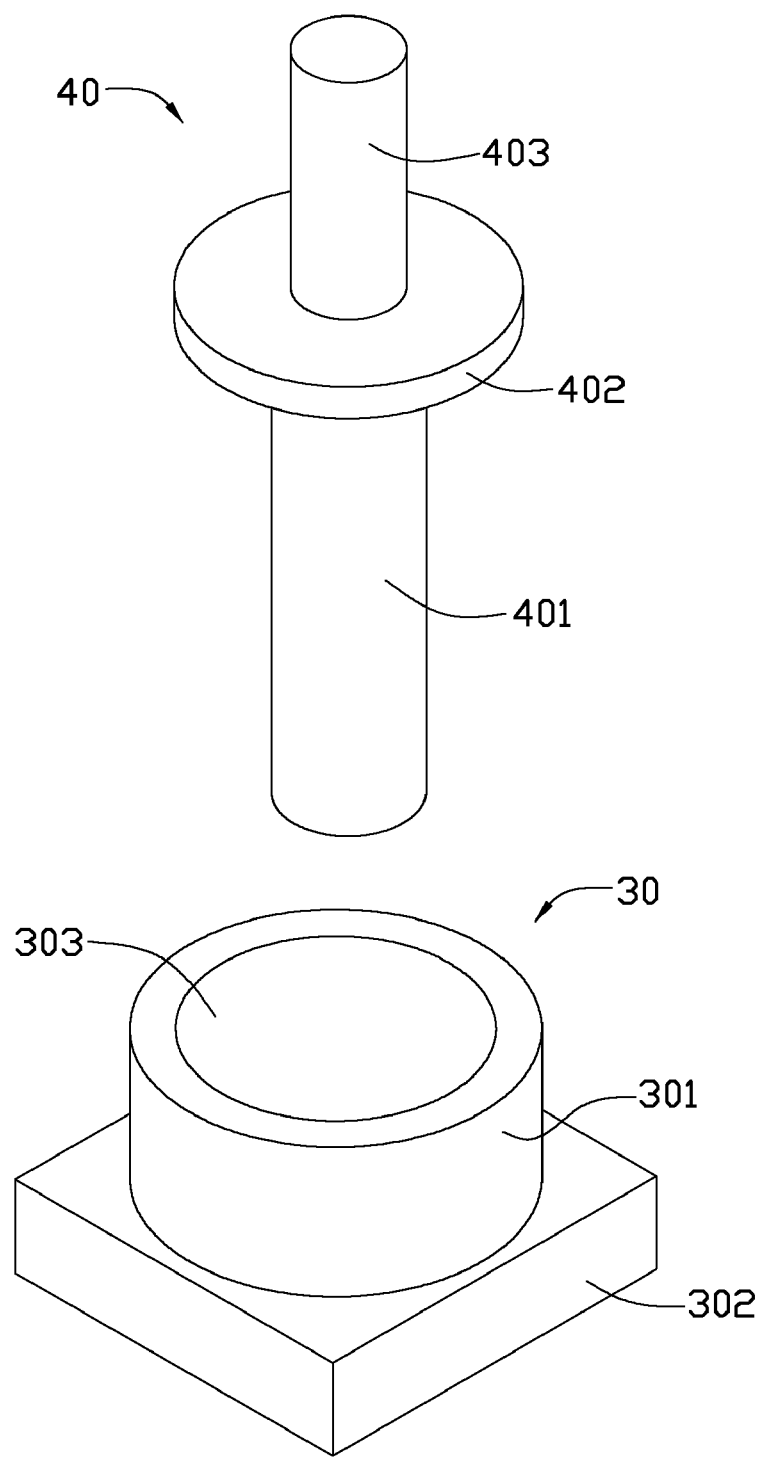
FIG. 5 is a schematic view of a positioning post and a lens holder in accordance with the first embodiment.

Referring to FIG. 5, the lens holder 30, a component frequently used in electronic imaging devices, includes a base 302 and a lens barrel 301. The lens barrel 301 is used to hold a lens (not shown) and defines a through hole 303 along the length of the lens barrel 301. The positioning post 40 includes a retaining portion 401, a holding portion 403 and a protrusion 402 connecting between the retaining portion 401 and the holding portion 403.

Figure 6:
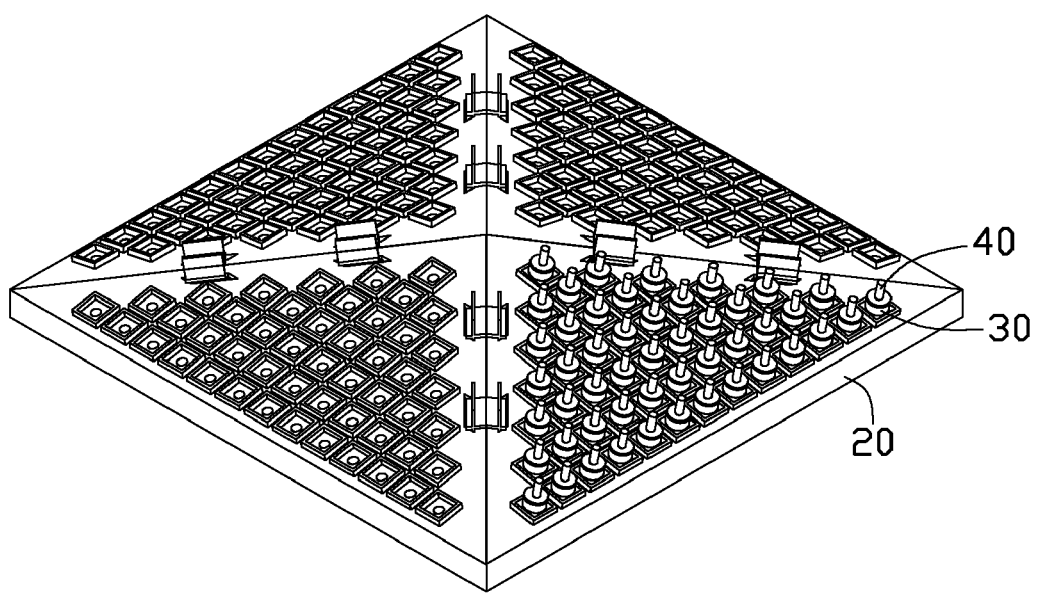
FIG. 6 is a sectional view similar to FIG. 1, but with the lens holder and the positioning post.

Also referring to FIG. 6, to position the lens holder 30 to the receiving portion 2055 of the tray device 201, the through hole 303 of the lens barrel 301 is aligned with the retaining hole 2057 of the receiving portion 2055 by an auxiliary positioning device (not shown). The retaining portion 401 of the positioning post 40 is then received in the through hole 303 and the retaining hole 2057. The positioning post 40 is formed in such a way that it accurately positions and holds stationary the lens holder 30.

The amount of the receiving portions 2055 of the tray assembly 20 are greater than conventional tray device, because the top walls 205 of the tray devices 201 are angled. The production efficiency of the tray assembly 20 is increased. The receiving portions 2055 of the adjacent tray devices 201 are arranged in loose. The high efficiency of heat dissipation is available. The tray devices 201 of the tray assembly 20 can be easily separated for storage and transportation.

Figure 7:
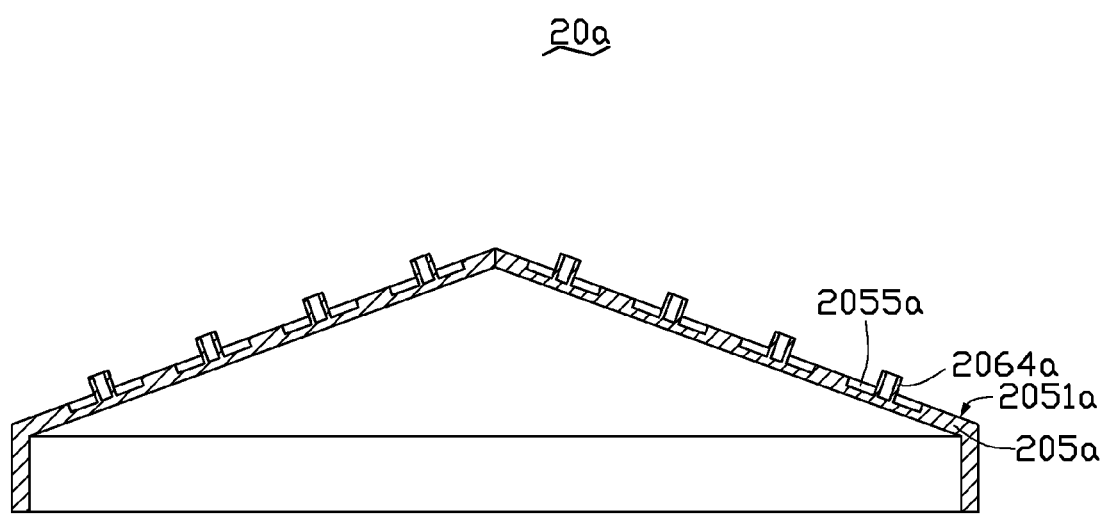
FIG. 7 is a cross-section of a tray assembly in accordance with a second embodiment.

FIG. 7 illustrates a tray assembly 20a of a second embodiment of the disclosure, differing from the first embodiment only in that the upper surface 2051a of the top wall 205a defines a plurality of concave receiving portions 2055a. A hollow cylinder 2064a substantially perpendicularly extends from the bottom of the concave receiving portions 2055a. The lens holder 30 is received in the hollow cylinder 2064a. The hollow cylinder 2064a is configured for receiving the retaining portion 401 of the positioning post 40.

It is to be understood, however, that even though numerous characteristics and advantages of various embodiments have been set forth in the foregoing description, together with details of the structures and functions of the embodiments, the disclosure is illustrative only; and that changes may be made in detail, especially in matters of arrangement of parts within the principles of the invention to the full extent indicated by the broad general meaning of the terms in which the appended claims are expressed.

What is claimed is:

1. A tray assembly comprising:

at least three tray devices contacted to each other, each tray device comprising an angled top wall and a sidewall connecting with the angled top wall, the angled top wall comprising an upper surface having a plurality of receiving portions, and each of the receiving portions being configured for receiving a lens holder, wherein a plurality of fixing holes is defined in the edge of each tray device; and a plurality of fixing members, wherein each fixing member is received in two corresponding fixing holes of two adjacent tray devices, respectively, and the at least three tray devices are thereby held together by the fixing members.

2. The tray assembly of claim 1, wherein each angled top wall is triangular.

3. The tray assembly of claim 1, wherein each fixing member comprises a main body, and two spaced tabs extending from the main body; and the tabs of the fixing member are received in the two fixing holes of the two adjacent tray devices.

4. The tray assembly of claim 1, wherein each receiving portion comprises a hollow cylinder configured for being received in the lens holder and receiving a positioning post.

5. The tray assembly of claim 1, wherein each receiving portion comprises a retaining hole defined in a central part thereof, and the retaining hole is configured for receiving a positioning post.

6. The tray assembly of claim 5, wherein the positioning post comprises a retaining portion, a holding portion, and a protrusion connecting between the retaining portion and the holding portion.

7. The tray assembly of claim 6, wherein the lens holder comprises a base and a lens barrel, the lens barrel defines a through hole along a length thereof, and the lens barrel contacts the base.

8. The tray assembly of claim 7, wherein the retaining portion of the positioning post is received in the through hole of the lens holder and the retaining hole of the receiving portion.

9. A tray assembly comprising:
   at least three tray devices contacted to each other, each tray device comprising an angled top wall and a sidewall connecting with the angled top wall, the angled top wall comprising an upper surface defining a plurality of concave receiving portions, and each concave receiving portion being configured for receiving a lens holder, wherein a plurality of fixing holes is defined in the edge of each tray device; and
   a plurality of fixing members, wherein each fixing member is received in two corresponding fixing holes of two adjacent tray devices, respectively, and the at least three tray devices are thereby held together by the fixing members.

10. The tray assembly of claim 9, wherein each angled top wall is triangular.

11. The tray assembly of claim 9, wherein each fixing member comprises a main body and two spaced tabs extending from the main body; and the tabs of the fixing member are received in the two fixing holes of the two adjacent tray devices.

12. The tray assembly of claim 9, wherein each concave receiving portion comprises a hollow cylinder configured for being received in the lens holder and receiving a positioning post.

13. The tray assembly of claim 9, wherein each concave receiving portion comprises a retaining hole defined in a central part thereof, and the retaining hole is configured for receiving a positioning post.

14. The tray assembly of claim 13, wherein the positioning post comprises a retaining portion, a holding portion, and a protrusion connecting between the retaining portion and the holding portion.

15. The tray assembly of claim 14, wherein the lens holder comprises a base and a lens barrel, the lens barrel defines a through hole along a length thereof, and the lens barrel contacts the base.

16. The tray assembly of claim 15, wherein the retaining portion of the positioning post is received in the through hole of the lens holder and the retaining hole of the concave receiving portion.

\* \* \* \* \*